US012396149B2

United States Patent
Jin

(10) Patent No.: US 12,396,149 B2
(45) Date of Patent: Aug. 19, 2025

(54) METHOD FOR FABRICATING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventor: Xuri Jin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 438 days.

(21) Appl. No.: 18/152,769

(22) Filed: Jan. 11, 2023

(65) Prior Publication Data

US 2024/0008245 A1 Jan. 4, 2024

(30) Foreign Application Priority Data

Jun. 29, 2022 (CN) .......................... 202210751680.5

(51) Int. Cl.
*H10B 12/00* (2023.01)
*H01L 21/3213* (2006.01)
*H10D 1/68* (2025.01)

(52) U.S. Cl.
CPC ......... *H10B 12/03* (2023.02); *H01L 21/3213* (2013.01); *H10D 1/696* (2025.01)

(58) Field of Classification Search
CPC ........ H10D 1/042; H10D 1/696; H10D 1/716; H10B 12/03; H10B 12/033; H01L 21/31144; H01L 21/3213
See application file for complete search history.

(56) References Cited

U.S. PATENT DOCUMENTS

2017/0103987 A1* 4/2017 Kim ..................... H10B 12/056

FOREIGN PATENT DOCUMENTS

| CN | 112908968 A | 6/2021 | |
| KR | 20140087357 A * | 7/2014 | ............. H10B 12/31 |

* cited by examiner

*Primary Examiner* — Edward Chin
(74) *Attorney, Agent, or Firm* — Kilpatrick Townsend & Stockton LLP

(57) ABSTRACT

Embodiments provide a method for fabricating a semiconductor structure, and a semiconductor structure, to solve a problem in related technologies that a support layer is prone to crack, resulting in collapse of capacitor. The method includes: forming a sacrificial layer and a support layer on a substrate, where the support layer includes a first support layer and a second support layer stacked, and the sacrificial layer includes a first sacrificial layer and a second sacrificial layer; forming a filling hole penetrating through the second support layer; and filling the filling hole with a sacrificial material to form a sacrificial portion.

12 Claims, 11 Drawing Sheets

METHOD FOR FABRICATING SEMICONDUCTOR STRUCTURE, AND SEMICONDUCTOR STRUCTURE

CROSS-REFERENCE TO RELATED APPLICATION

This application claims priority to Chinese Patent Application No. 202210751680.5, titled "METHOD FOR FABRICATING SEMICONDUCTOR STRUCTURE, AND SEMICONDUCTOR STRUCTURE" and filed to the State Patent Intellectual Property Office on Jun. 29, 2022, the entire contents of which are incorporated herein by reference.

TECHNICAL FIELD

The present disclosure relates to the field of semiconductor technology, and more particularly, to a method for fabricating a semiconductor structure, and a semiconductor structure.

BACKGROUND

As a semiconductor apparatus commonly used in electronic devices such as computers, Dynamic Random Access Memory (DRAM) comprises a plurality of memory cells, and each of the memory cells typically includes a transistor and a capacitor. The transistor has a gate electrically connected to a word line, a source electrically connected to a bit line, and a drain electrically connected to the capacitor. A word line voltage of the word line may control turn-on and turn-off of the transistor, such that data information stored in the capacitor can be read or written into the capacitor by means of the bit line. A capacitor typically includes an upper electrode layer, a dielectric layer, and a lower electrode layer provided between two support layers. However, in related fabrication technologies, the support layers are prone to crack, resulting in collapse of the capacitor.

SUMMARY

Embodiments of the present disclosure provide a method for fabricating a semiconductor structure and a semiconductor structure.

In a first aspect, the embodiments of the present disclosure provide a method for fabricating a semiconductor structure, including:
 providing a substrate;
 forming a sacrificial layer and a support layer on the substrate, where the support layer comprises a first support layer and a second support layer stacked, and the sacrificial layer comprises a first sacrificial layer and a second sacrificial layer, and the second sacrificial layer, the second support layer, the first sacrificial layer, and the first support layer are sequentially stacked on the substrate from bottom to top;
 forming a filling hole on the second support layer, where the filling hole penetrates through the first support layer, the first sacrificial layer, and the second support layer;
 filling the filling hole with a sacrificial material to form a sacrificial portion;
 forming a filling space on the substrate; and
 forming a capacitor in the filling space.

In a second aspect, the embodiments of the present disclosure further provide a semiconductor structure, including a substrate, and a sacrificial layer and a support layer provided on the substrate. The support layer comprises a first support layer and a second support layer, and the sacrificial layer comprises a first sacrificial layer and a second sacrificial layer. The second sacrificial layer, the second support layer, the first sacrificial layer and the first support layer are sequentially stacked on the substrate from bottom to top.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
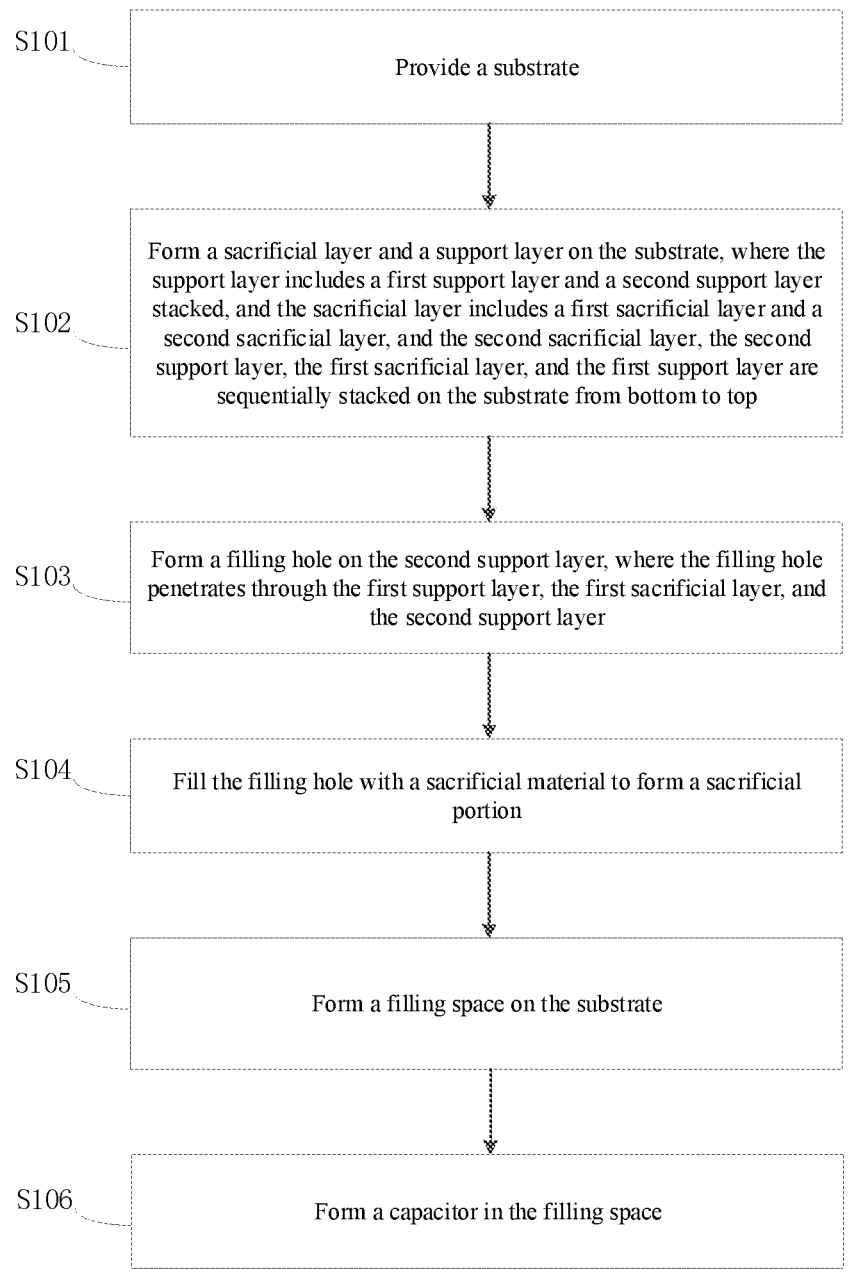
FIG. 1 is a schematic flow diagram of a method for fabricating a semiconductor structure according to an embodiment of the present disclosure.

In the related technologies, a capacitor typically includes an upper electrode layer, a dielectric layer and a lower electrode layer provided between two support layers. Fabrication processes of the capacitor include: forming a sacrificial layer and a support layer on a substrate, where part of the support layer is positioned at the top and bottom of the sacrificial layer, and part of the support layer is also positioned in the middle of the sacrificial layer; after a capacitor hole is formed, part of the support layer positioned at the top of the sacrificial layer needing to be etched to form an opening; and etching, using a remaining part of the support layer at the top as a mask, part of the support layer positioned in the middle of the sacrificial layer corresponding to the opening, to remove the entire sacrificial layer. However, during the etching process using the support layer positioned at the top of the sacrificial layer as the mask, because part of the remaining part of the support layer at the top is also etched away, the support layer positioned at the top of the sacrificial layer is thinned. That is, the support layer positioned on the side of the capacitor facing away from the substrate is thinned, and then cracks appear, which further leads to collapse of the capacitor hole during the fabrication process of the capacitor, such that the capacitor cannot be formed.

In view of this, embodiments of the present disclosure provide a method for fabricating a semiconductor structure, and a semiconductor structure. The method includes: forming a sacrificial layer and a support layer on a substrate, where the support layer comprises a first support layer and a second support layer stacked, and the sacrificial layer comprises a first sacrificial layer and a second sacrificial layer, and the second sacrificial layer, the second support layer, the first sacrificial layer, and the first support layer are sequentially stacked on the substrate from bottom to top; forming a filling hole on the second support layer, where the filling hole penetrates through the first support layer, the first sacrificial layer, and the second support layer; filling the filling hole with a sacrificial material to form a sacrificial portion; forming a filling space on the substrate; and forming a capacitor in the filling space. In contrast to removing part of the support layer positioned in a middle of the sacrificial layer by using a part of the support layer as a mask in the related technologies, in the embodiments of the present disclosure, part of the first support layer and part of the second support layer are simultaneously removed to form the filling hole penetrating through the second support layer. It is not required to etch the first support layer when removing the sacrificial layer by means of the filling hole, thereby avoiding loss of rest of the first support layer from thinning and preventing cracks of the first support layer, which is advantageous to improving performance of the semiconductor structure.

To make the objectives, technical solutions and advantages of the present disclosure clearer, the technical solutions in the embodiments of the embodiments of the present disclosure will be described in more detail below with reference to the accompanying drawings in some embodiments of the present disclosure. Throughout the drawings, the same or similar numerals represent the same or similar elements or elements having the same or similar functions. Apparently, the described embodiments are some but not all of the embodiments of the present disclosure. The embodiments described with reference to the drawings are exemplary, just intended to explain the present disclosure, not interpreted as limiting the present disclosure. All other embodiments obtained by persons of ordinary skill in the art based on the embodiments of the present disclosure without creative efforts shall fall within the protection scope of the present disclosure. The embodiments of the present disclosure will be described in detail below with reference to the accompanying drawings.

It should be noted that the semiconductor structure provided by the embodiments of the present disclosure may be a memory device or a non-memory device. The memory device may include, for example, dynamic random access memory (DRAM), static random access memory (SRAM), flash memory, electrically erasable programmable read-only memory (EEPROM), phase change random access memory (PRAM) or magnetoresistive random access memory (MRAM). The non-memory device may be a logic device (e.g., microprocessors, digital signal processors, or microcontrollers) or similar devices. In the embodiments of the present disclosure, a DRAM memory device is taken as an example for description.

Referring to FIG. 1, the method for fabricating the semiconductor structure provided by the embodiments of the present disclosure includes:

Step S101: providing a substrate.

Figure 2:
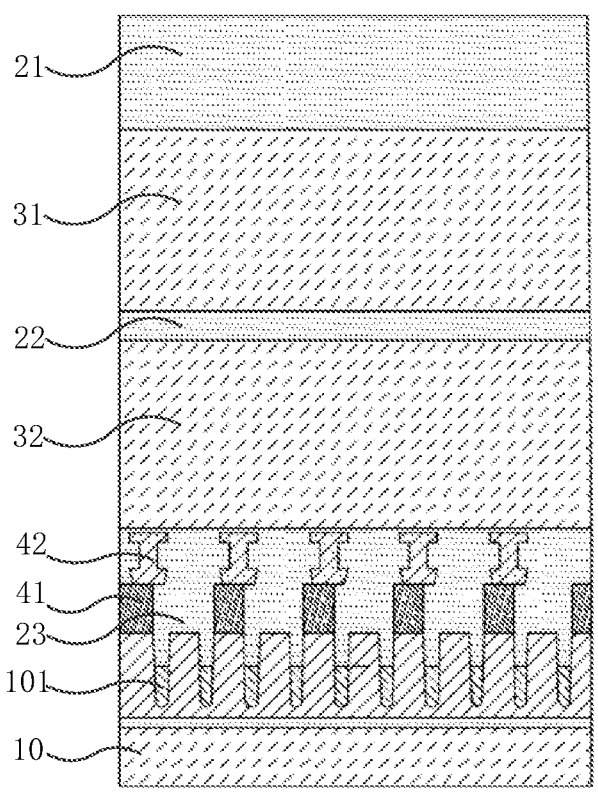
FIG. 2 is a schematic structural diagram of forming a sacrificial layer and a support layer in a method for fabricating a semiconductor structure according to an embodiment of the present disclosure.

Referring to FIG. 2, a substrate 10 may provide a structural basis to subsequent structures and processes, where a material of the substrate 10 may include any one or more of silicon, germanium, silicon germanium, silicon carbide, silicon-on-insulator (SOI) substrate 10 and germanium-on-insulator (GOI) substrate 10. In this embodiment, the material of the substrate 10 may be silicon. In this embodiment, a plurality of buried transistors 101 are further disposed in the substrate 10.

In this embodiment, after the substrate 10 is provided, the method further includes: forming a plurality of capacitor plugs 41 arranged at intervals in the substrate 10, where each of the capacitor plugs 41 is electrically connected to a source or a drain of the transistor 101. Materials of the capacitor plugs 41 may include, for example, conductive metals such as titanium and tungsten.

In this embodiment, after the plurality of capacitor plugs 41 arranged at intervals are formed in the substrate 10, and after the step of providing the substrate 10, the method further includes: forming a corresponding landing pad 42 on each of the plurality of capacitor plugs 41, where the landing pad 42 is electrically connected to each of the plurality of capacitor plugs 41. The landing pad 42 is electrically connected to the capacitor plug 41, such that a subsequently formed capacitor is electrically connected to the source/drain of the transistor through the landing pad 42 and the capacitor plug 41, and thus the transistor 101 can transmit a voltage signal to the capacitor through the landing pad 42 and the capacitor plug 41.

In this embodiment, after the substrate 10 is provided, the method also includes:

Step S102, forming a sacrificial layer and a support layer on the substrate, where the support layer comprises a first support layer and a second support layer stacked, and the sacrificial layer comprises a first sacrificial layer and a second sacrificial layer, and the second sacrificial layer, the second support layer, the first sacrificial layer, and the first support layer are sequentially stacked on the substrate from bottom to top.

With continued reference to FIG. 2, in this embodiment, the support layer further includes a third support layer 23, where the third support layer 23 is positioned on a surface of the substrate 10 and is positioned on a side of the second support layer close to the substrate 10, and the second sacrificial layer 32 is positioned between the third support layer 23 and the second support layer 22. The third support layer 23 covers the landing pad 42. By arranging the first sacrificial layer 31 and the second sacrificial layer 32, space is provided for subsequent formation of the capacitor having a higher depth-to-width ratio. By arranging the first support layer 21, the second support layer 22 and the third support layer 23, the first support layer 21, the second support layer 22 and the third support layer 23 are provided to support the capacitor formed subsequently, to prevent the capacitor from tilting.

In this embodiment, after the support layer and the sacrificial layer are formed on the substrate 10, the method further includes:

Step S103, forming a filling hole on the second support layer, where the filling hole penetrates through the first support layer, the first sacrificial layer, and the second support layer.

Figure 3:
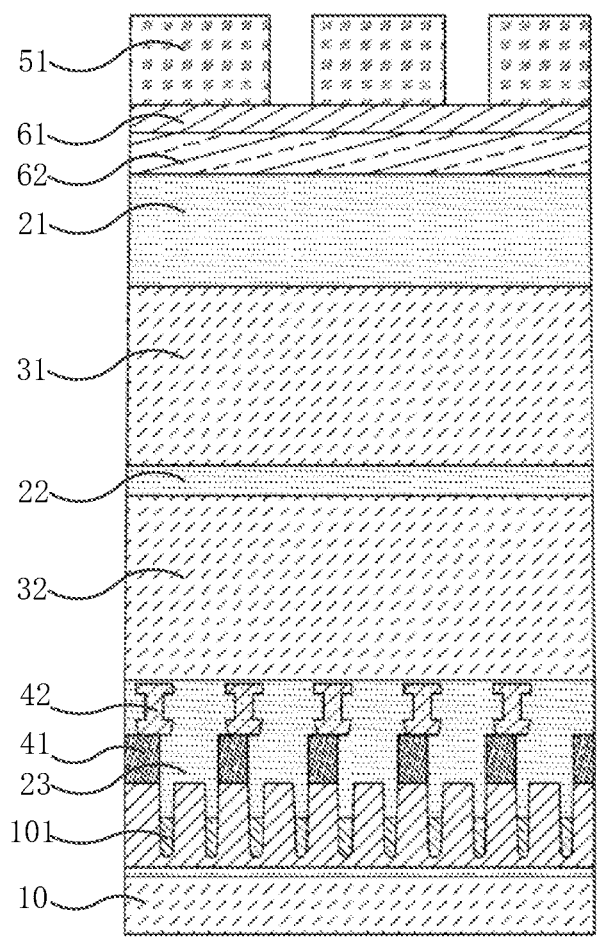
FIG. 3 is a schematic structural diagram of forming a first photoresist layer in a method for fabricating a semiconductor structure according to an embodiment of the present disclosure.

Referring to FIG. 3, in this embodiment, the step of forming the filling hole 201 includes: forming a first photoresist layer 51 on the first support layer 21, where the first photoresist layer 51 has a first opening. For example, before the first photoresist layer 51 is formed on the first support layer 21, a first carbon layer 62 and a first anti-reflection layer 61 are sequentially formed on the first support layer 21, to improve lithography accuracy of the first photoresist layer 51. A material of the first anti-reflection layer 61 may include, for example, silicon oxynitride (SiON).

Figure 4:
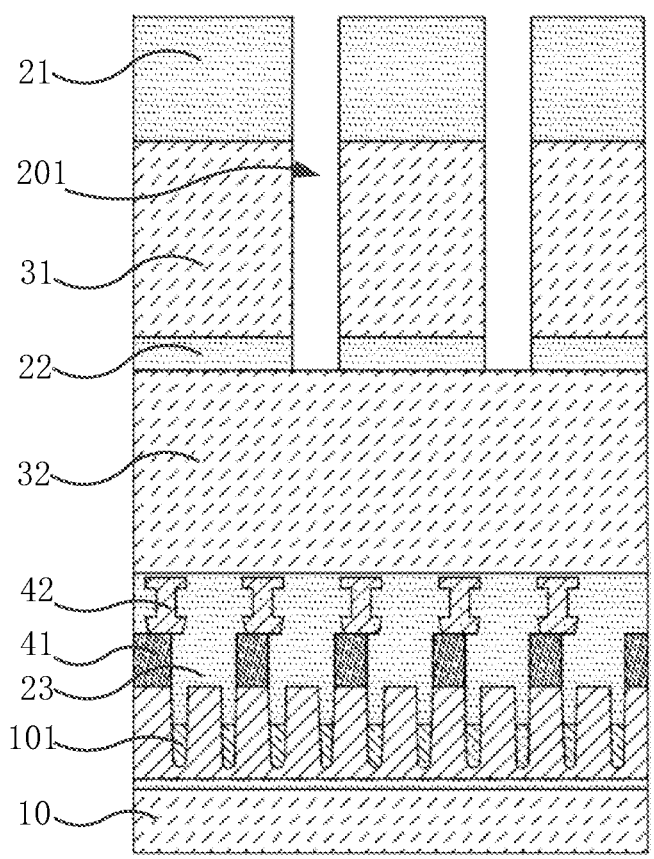
FIG. 4 is a schematic structural diagram of forming a filling hole in a method for fabricating a semiconductor structure according to an embodiment of the present disclosure.

Referring to FIG. 4, after the first photoresist layer 51 is formed, the step of forming the filling hole 201 further includes: sequentially etching, using the first photoresist layer 51 as a mask, part of the first support layer 21, part of the first sacrificial layer 31 and part of the second support layer 22 corresponding to the first opening to form the filling hole 201. Part of the first support layer 21 and part of the second support layer 22 are removed simultaneously using the first photoresist layer 51 as a mask, to prevent from etching the second support layer 22 by means of the first support layer 21, thereby avoiding the loss of the first support layer 21 from thinning. For example, the filling hole 201 penetrates through the second support layer 22 and also penetrates through the first support layer 21 and the first sacrificial layer 31, and the side wall of the filling hole 201 exposes the first support layer 21, the first sacrificial layer 31 and the second support layer 22. By arranging the filling hole 201, part of the first sacrificial layer 31 and part of the second sacrificial layer 32 are exposed. Herein, "exposure" means that part of the first sacrificial layer 31 is not covered by the first support layer 21, and part of the second sacrificial layer 32 is not covered by the second support layer 22.

In this embodiment, part of the first support layer 21, part of the first sacrificial layer 31 and part of the second support layer 22 may be removed by means of anisotropic dry etching, to improve the accuracy of etching. In some embodiments, the second support layer 22 may be etched using a mixed gas containing chlorine or fluorine as an etching gas. In some embodiments, before part of the second support layer 22 is removed by means of dry etching, part of the first support layer 21 and part of the first sacrificial layer 31 may also be removed by means of dry etching, thereby reducing bombardment energy of the first support layer 21, and avoiding causing damage to the second sacrificial layer 32 and the substrate structure.

In some other embodiments, the step of forming the filling hole 201 further includes: after the first photoresist layer 51 is formed, sequentially etching, using the first photoresist layer 51 as a mask, part of the first support layer 21, part of the first sacrificial layer 31, part of the second support layer 22 and part of the second sacrificial layer 32 corresponding to the first opening to form the filling hole 201. A side wall of the filling holes 201 expose the first support layer 21, the first sacrificial layer 31, the second support layer 22, and the second sacrificial layer 32.

In this embodiment, after the filling hole 201 is formed, the method further includes:

Step S104, filling the filling hole with a sacrificial material to form a sacrificial portion.

Figure 5:
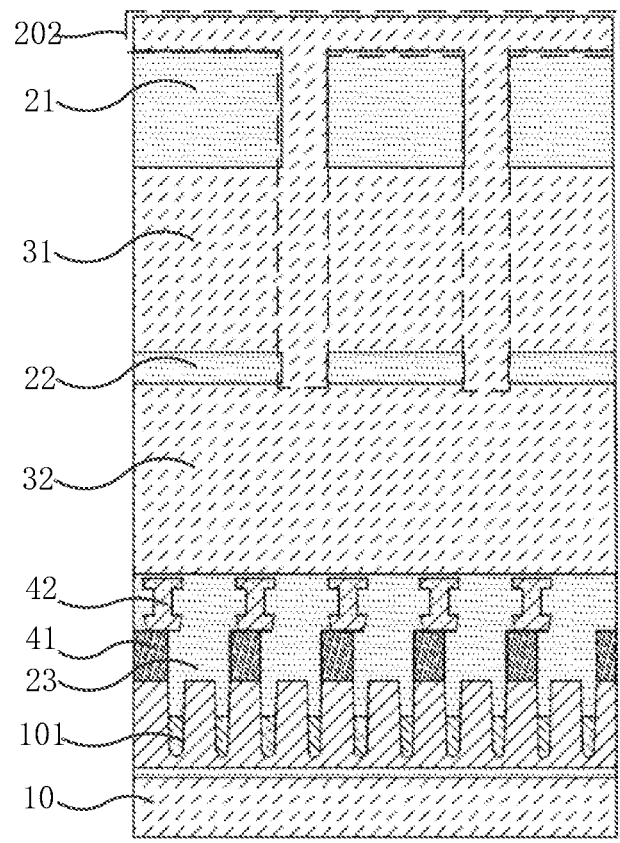
FIG. 5 is a schematic structural diagram of forming a sacrificial material in a method for fabricating a semiconductor structure according to an embodiment of the present disclosure.

Referring to FIG. 5, in this embodiment, the step of forming the sacrificial portion 24 includes: the sacrificial material 202 filling up the filling hole 201, and the sacrificial material 202 covering the surface of the first support layer 21. The sacrificial material 202 is removed by part of a thickness to form the sacrificial portion 24, and a top surface of the sacrificial portion 24 is flush with a top surface of the third support layer 23. When the filling hole 201 is filled with the sacrificial material 202, the sacrificial material 202 overflows the filling hole 201, which is beneficial for the sacrificial material 202 to fill up the filling hole 201, and avoids a gap in the filling hole 201.

Figure 6:
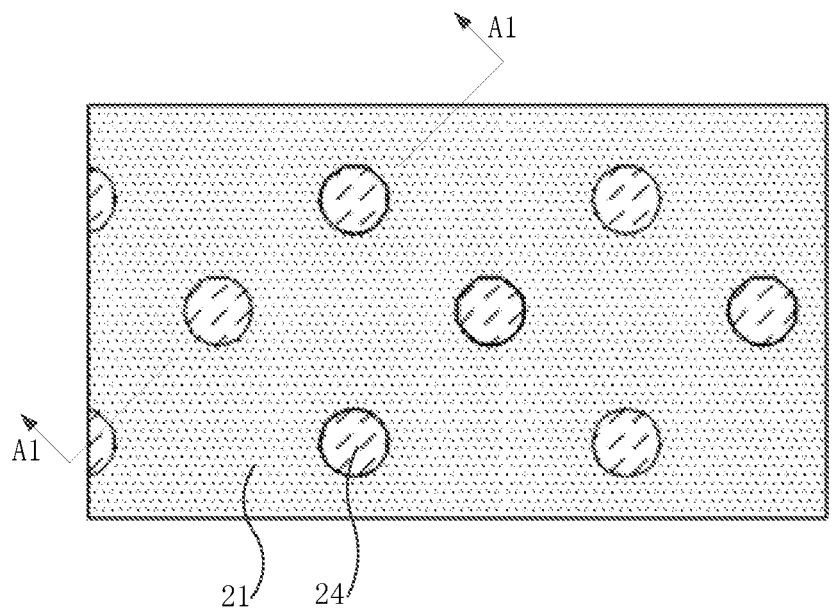
FIG. 6 is a schematic structural diagram of forming a sacrificial portion in a method for fabricating a semiconductor structure according to an embodiment of the present disclosure.
Figure 7:
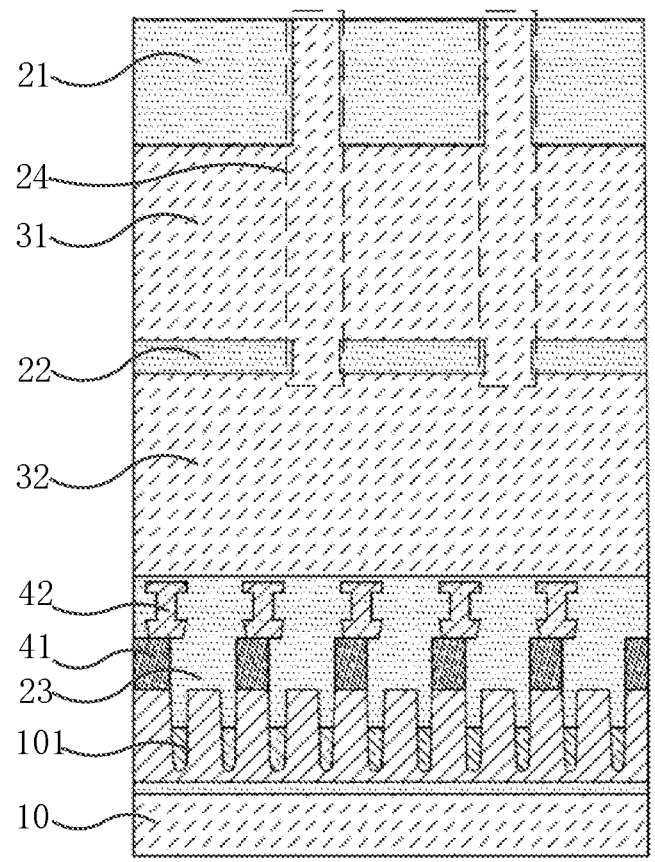
FIG. 7 is a sectional view at A1-A1 in FIG. 6.

Referring to FIG. 6 and FIG. 7, after the sacrificial material 202 is filled in the filling hole 201, a part of the sacrificial material 202 is removed until the surface of the first support layer 21 is exposed. The remaining sacrificial material 202 in the filling hole 201 forms the sacrificial portion 24, where the top surface of the sacrificial portion 24 is flush with the top surface of the third support layer 23 to ensure flatness of film layer structures subsequently covering the top surface of the third support layer 23.

In this embodiment, after the sacrificial portion 24 is formed, the method further includes:

Step S105, forming a filling space on the substrate.

Referring to FIG. 8 to FIG. 15, in the present disclosure, the forming the filling space 204 includes: providing space for forming the capacitor after the sacrificial portion 24, the sacrificial layer, part of the first support layer 21 and part of the second support layer 22 are removed, such that part of the capacitor penetrates through the first support layer 21 and the second support layer 22 to prevent the capacitor from tilting.

In this embodiment, after the filling space 204 is formed, the method further includes:

Step S106, forming a capacitor in the filling space.

In this embodiment, the capacitor includes a lower electrode layer 81, a dielectric layer, and an upper electrode layer. A terminal of the lower electrode layer 81 is in contact with the first support layer 21, other terminal of the lower electrode layer 81 is in contact with the third support layer 23, the second support layer 22 is arranged around the lower electrode layer 81, the dielectric layer covers a surface of the lower electrode layer 81, and the upper electrode layer covers a surface of the dielectric layer. By arranging the first support layer 21, the second support layer 22 and the third support layer 23, a top, a middle and a bottom of the lower electrode layer 81 are respectively supported to prevent the lower electrode layer 81 from tilting.

The embodiments of the present disclosure provide a method for fabricating a semiconductor structure, including: forming a sacrificial layer and a support layer on the substrate 10, where the support layer comprises a first support layer 21 and a second support layer 22 stacked, and the sacrificial layer comprises a first sacrificial layer 31 and a second sacrificial layer 32, and the second sacrificial layer 32, the second support layer 22, the first sacrificial layer 31, and the first support layer 21 are sequentially stacked on the substrate 10 from bottom to top; forming a filling hole 201 on the second support layer 22, where the filling hole 201 penetrates through the first support layer 21, the first sacrificial layer 31, and the second support layer 22; filling the filling hole 201 with a sacrificial material 202 to form a sacrificial portion 24; forming a filling space 204 on the substrate 10; and forming a capacitor in the filling space 204. In contrast to removing part of the support layer positioned in a middle of the sacrificial layer by using a part of the support layer 21 as a mask in the related technologies, in the embodiments of the present disclosure, before the filling space 204 is removed, part of the first support layer 21 and part of the second support layer 22 are simultaneously removed to form the filling hole 201 penetrating through the second support layer 22. It is not required to etch the first support layer 21 when removing the sacrificial layer by means of the filling hole 201, thereby avoiding loss of rest of the first support layer 21 from thinning and preventing cracks of the first support layer 21, which is advantageous to improving performance of the semiconductor structure.

Figure 8:
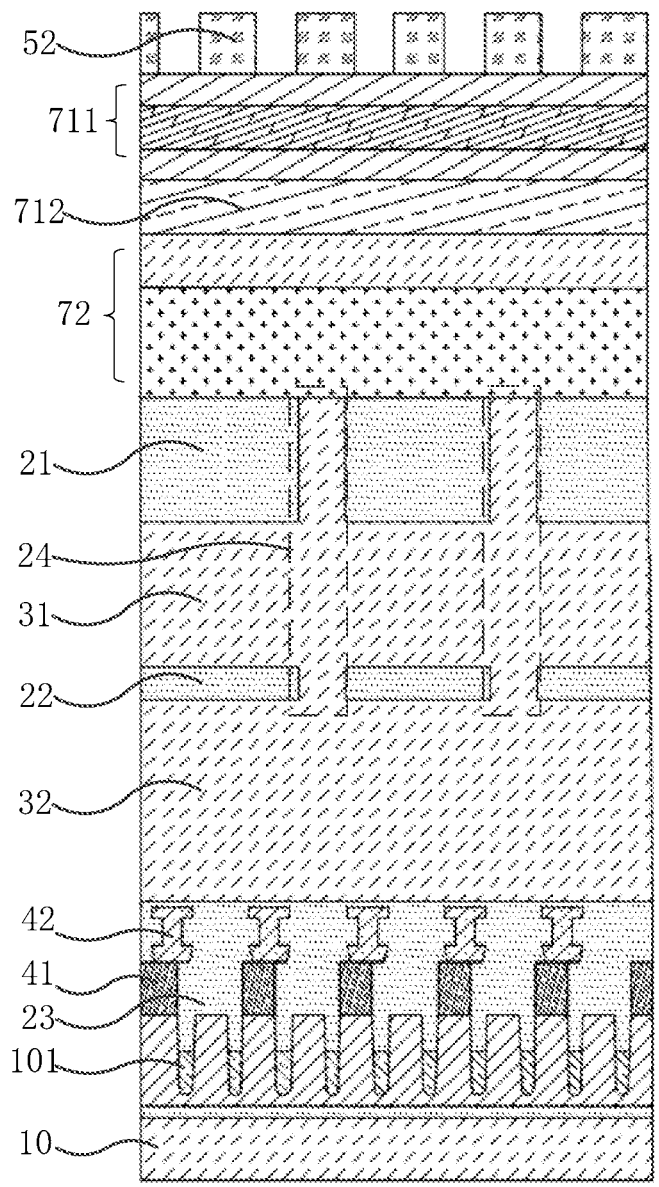
FIG. 8 is a schematic structural diagram of forming a second photoresist layer in a method for fabricating a semiconductor structure according to an embodiment of the present disclosure.
Figure 9:
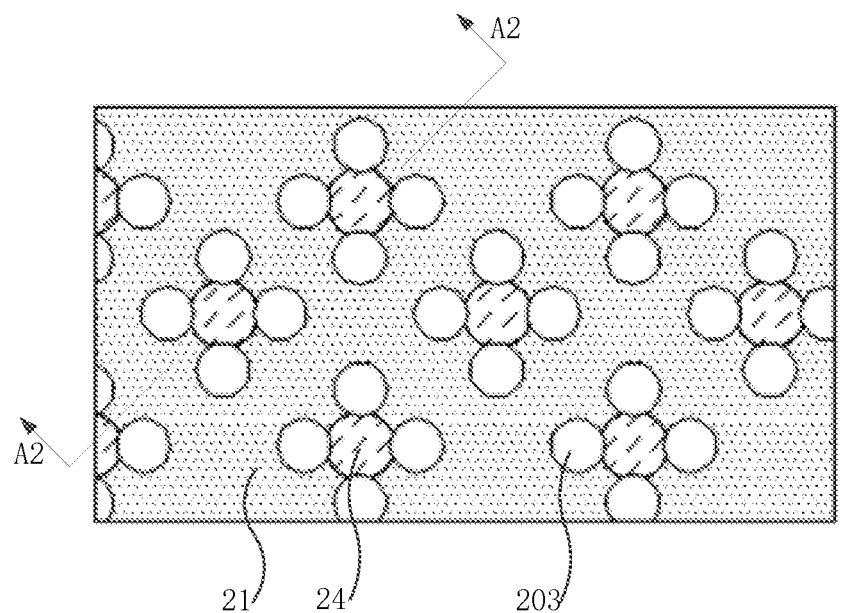
FIG. 9 is a schematic structural diagram of forming a capacitor hole in a method for fabricating a semiconductor structure according to an embodiment of the present disclosure.
Figure 10:
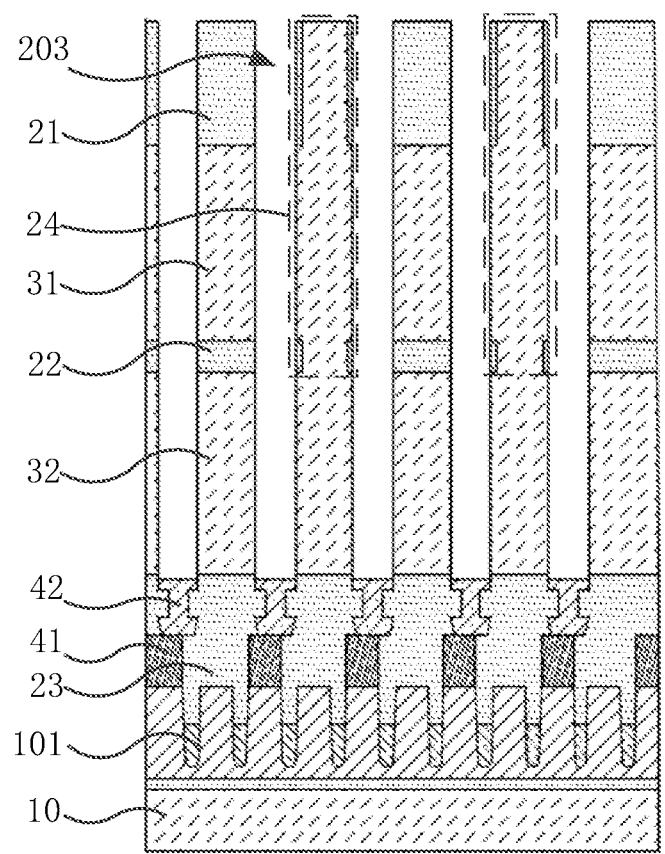
FIG. 10 is a sectional view at A2-A2 in FIG. 9.

Referring to FIGS. 8, 9 and 10, in this embodiment, the step of forming the capacitor includes: removing part of the support layer, part of the sacrificial layer and part of the sacrificial portion 24 to form a capacitor hole 203, where an orthographic projection of the capacitor hole 203 on the substrate 10 at least partially overlaps with an orthographic projection of the sacrificial portion 24 on the substrate 10.

For example, referring to FIG. 9, there may be a plurality of sacrificial portions 24, and the orthographic projections of the plurality of sacrificial portions 24 on the substrate 10 are arranged in an array. An orthographic projection of the capacitor hole 203 on the substrate 10 at least partially overlaps with the orthographic projection of the sacrificial portion 24 on the substrate 10, such that the lower electrode layer 81 subsequently formed in the capacitor hole 203 is in contact with the sacrificial portion 24.

Referring to FIG. 8, the step of forming the capacitor hole 203 includes: forming a second photoresist layer 52 on the surface of the first support layer 21 and a surface of the sacrificial portion 24, where the second photoresist layer 52 has a second opening. Before the second photoresist layer 52 is formed, a hard mask layer 72, a second carbon layer 712 and a second anti-reflection layer 711 are sequentially formed on the first support layer 21, where the hard mask layer 72 may include a first hard mask layer 72 and a second hard mask layer 72, and the second hard mask layer 72 is positioned between the first hard mask layer 72 and the carbon layer. A material of the hard mask layer 72 may include, for example, one or more of polysilicon (ploy), silicon nitride ($Si_3N_4$), silicon oxide ($SiO_2$, SiO) or silicon oxynitride (SiON). The second anti-reflection layer 711 may include, for example, a plurality of anti-reflection layers stacked having different extinction coefficients. By providing the second anti-reflection layer 711 and the second carbon layer 712, it is advantageous to improving photolithography accuracy of the second photoresist layer 52.

In this embodiment, an orthographic projection of the second opening on the substrate 10 at least partially overlaps the orthographic projection of the sacrificial portion 24 on the substrate 10, such that the orthographic projection of the subsequently formed capacitor hole 203 on the substrate 10 at least partially overlaps with the orthographic projection of the sacrificial portion 24 on the substrate 10. Based on the above arrangement, in the subsequent process of removing the sacrificial layer, the etching process can be quickly diffused to the adjacent sacrificial layer by means of the sacrificial portions 24, such that the etching rate is accelerated. Moreover, the etching process does not adversely affect the first support layer 21, thereby preventing the first support layer 21 from being thinned.

Furthermore, the orthographic projections of at least three second openings on the substrate are arranged at equal intervals around the circumference of the orthographic projection of the sacrificial portion on the substrate, such that at least three capacitor holes 203 are uniformly arranged along the circumferential direction of the sacrificial portion 24, and at least three lower electrode layers 81 that can support the first support layer 21 and the second support layer 22 are formed subsequently; moreover, the removal of the sacrificial layer of each capacitor hole 203 is accelerated by means of the removal of the sacrificial portion 24, to facilitate uniform diffusion of the etching liquid to the sacrificial layer. For example, in this embodiment, four capacitor holes 203 may be uniformly arranged in the circumferential direction of each sacrificial portion 24.

Furthermore, the orthographic projection of the second opening of the second photoresist layer 52 on the substrate 10 at least partially overlaps with the landing pad 42, such that the orthographic projection of the capacitor hole 203 formed on the substrate 10 at least partially overlaps with the landing pad 42, and part of the capacitor formed is in contact with the landing pad 42. In some embodiments, the orthographic projection of the second opening on the substrate 10 may completely overlap with the landing pad 42, thereby ensuring the reliability of connection between the capacitor formed subsequently and the landing pad 42.

Referring to FIG. 10, after the second photoresist layer 52 is formed, the step of forming the capacitor hole 203 further includes: sequentially etching, using the second photoresist layer 52 as a mask, part of the first support layer 21, part of the first sacrificial layer 31, part of the second support layer 22 and part of the second sacrificial layer 32 corresponding to the second opening to form the capacitor hole 203. It is worth noting that before the sequentially etching, using the second photoresist layer 52 as the mask, part of the first support layer 21, part of the first sacrificial layer 31, part of the second support layer 22 and part of the second sacrificial layer 32 corresponding to the second opening, the method further includes: etching the hard mask layer 72 by using the second photoresist layer 52 as the mask, to transfer a pattern on the second photoresist layer 52 to the hard mask layer 72. Part of the first support layer 21, part of the first sacrificial layer 31, part of the second support layer 22 and part of the second sacrificial layer 32 are sequentially etched using the hard mask layer 72 with the transferred pattern as a mask to form the capacitor hole 203.

In some embodiments, the top surface of the third support layer 23 may be flush with the landing pad 42, and after part of the first support layer 21, part of the first sacrificial layer 31, part of the second support layer 22 and part of the second sacrificial layer 32 are sequentially etched using the second photoresist layer 52 as a mask, the capacitor hole 203 formed exposes the surface of the landing pad 42. In some other embodiments, the third support layer 23 also covers the top surface of the landing pad 42, and after part of the first support layer 21, part of the first sacrificial layer 31, part of the second support layer 22 and part of the second sacrificial layer 32 are sequentially etched using the second photoresist layer 52 as a mask, the step of forming the capacitor hole 203 further includes continuing removing part of the third support layer 23 until etching to the landing pad 42, such that the capacitor hole 203 formed exposes the surface of the landing pad 42.

Figure 11:
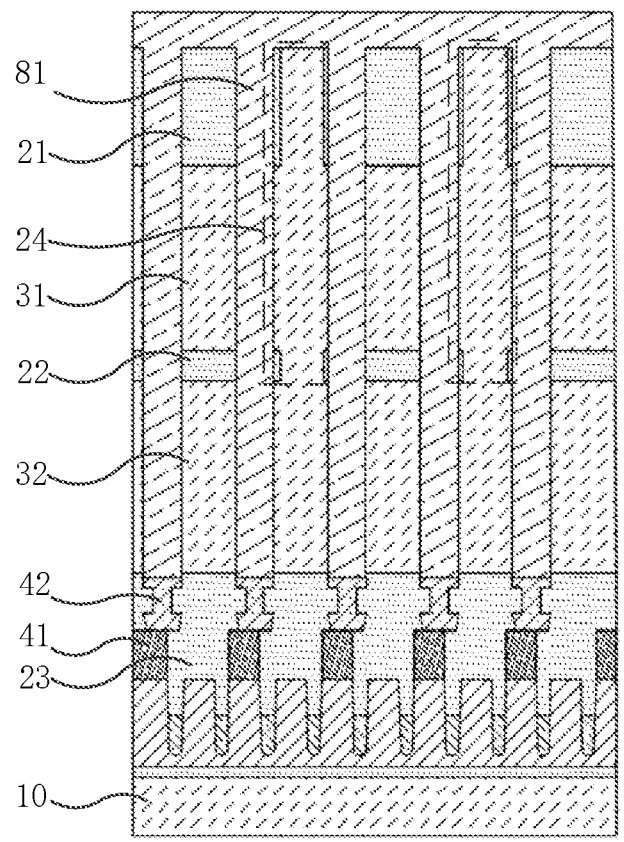
FIG. 11 is a schematic structural diagram I of forming a lower electrode layer in a method for fabricating a semiconductor structure according to an embodiment of the present disclosure.
Figure 12:
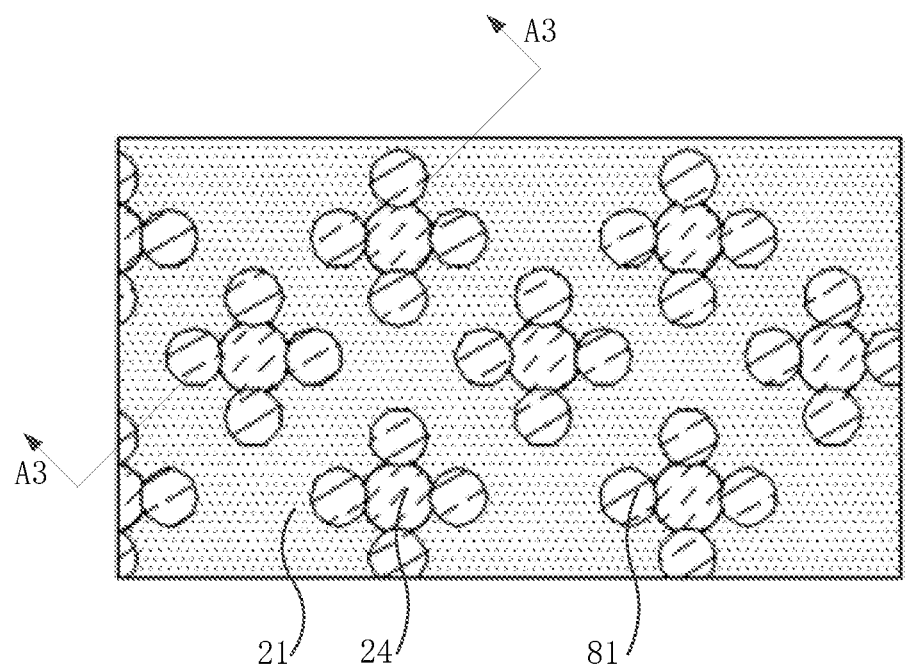
FIG. 12 is a schematic structural diagram II of forming a lower electrode layer in a method for fabricating a semiconductor structure according to an embodiment of the present disclosure.
Figure 13:
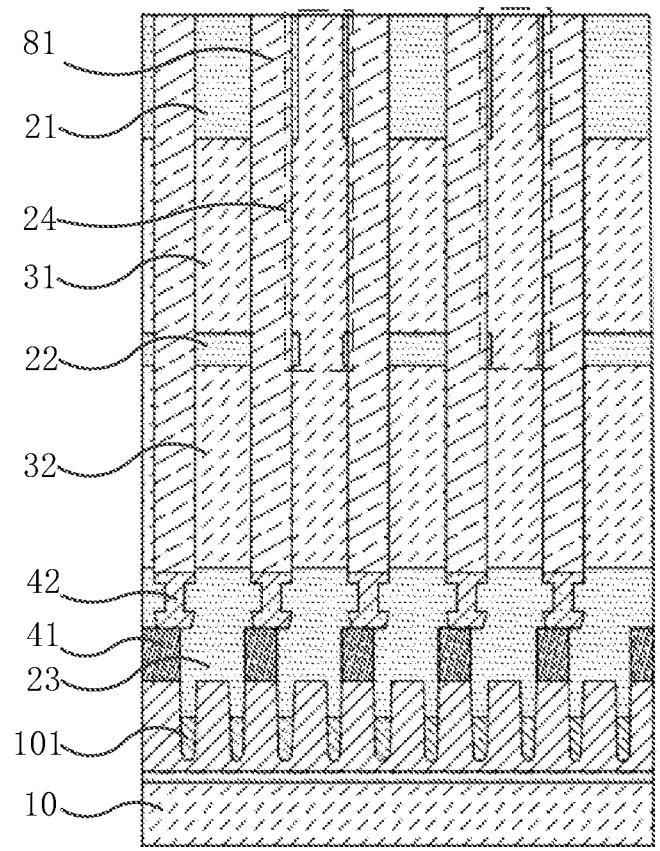
FIG. 13 is a sectional view at A3-A3 in FIG. 12.

Referring to FIGS. 11, 12 and 13, in this embodiment, after the capacitor hole 203 is formed, the step of forming the capacitor further includes: forming a lower electrode layer 81 in the capacitor hole 203. Because the capacitor hole 203 penetrates through the second support layer 22 and the first support layer 21, the lower electrode layer 81 formed penetrates through the second support layer 22 and the first support layer 21, the first support layer 21 can support the top of the lower electrode layer 81, and the second support layer 22 can support the middle of the lower electrode layer 81, which is advantageous to preventing the capacitor from tilting. In some other embodiments, the third support layer 23 also covers the top surface of the landing pad 42, and the step of forming the capacitor hole 203 further includes: removing part of the third support layer 23, such that part of the lower electrode layer 81 formed is positioned in the third support layer 23, and the third support layer 23 can support the bottom of the lower electrode layer 81, which is advantageous to preventing the capacitor from tilting. Because the capacitor hole 203 exposes the surface of the landing pad 42, the lower electrode layer 81 is in contact with the landing pad 42, and the lower electrode layer 81 is electrically connected to the landing pad 42, such that the capacitor formed subsequently is electrically connected to the capacitor plug 41 by means of the landing pad 42.

It should be noted that, as shown in FIG. 11, when the lower electrode layer 81 is formed, the lower electrode layer 81 also covers the first support layer 21, such that the lower electrode layer 81 fills up the capacitor hole 203, and a gap in the capacitor hole 203 is avoided. As shown in FIG. 12 and FIG. 13, after forming the lower electrode layer 81 and before forming the filling space 204, the method further includes: removing the lower electrode layer 81 covering the first support layer 21, and retaining only the lower electrode layer 81 positioned in the capacitor hole 203.

Figure 14:
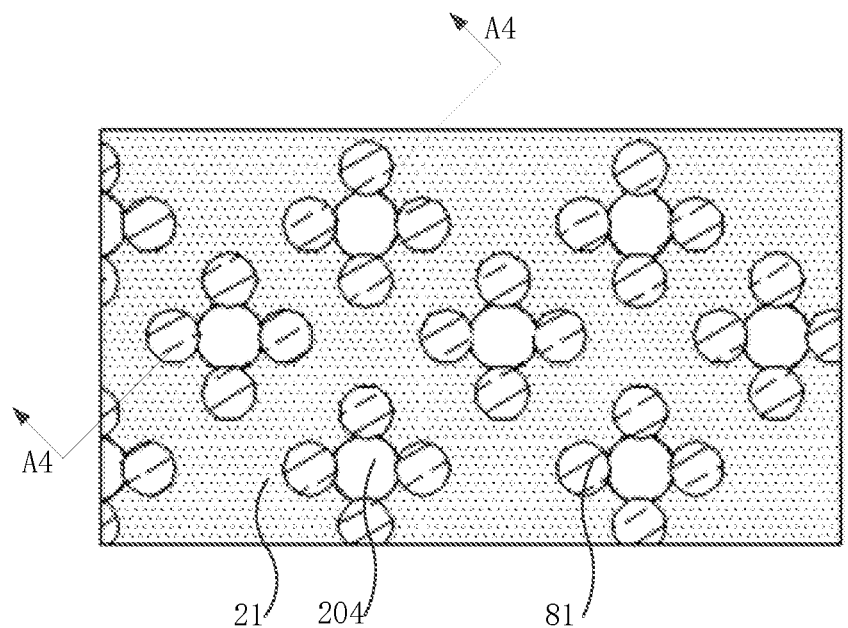
FIG. 14 is a schematic structural diagram of forming a filling space in a method for fabricating a semiconductor structure according to an embodiment of the present disclosure.
Figure 15:
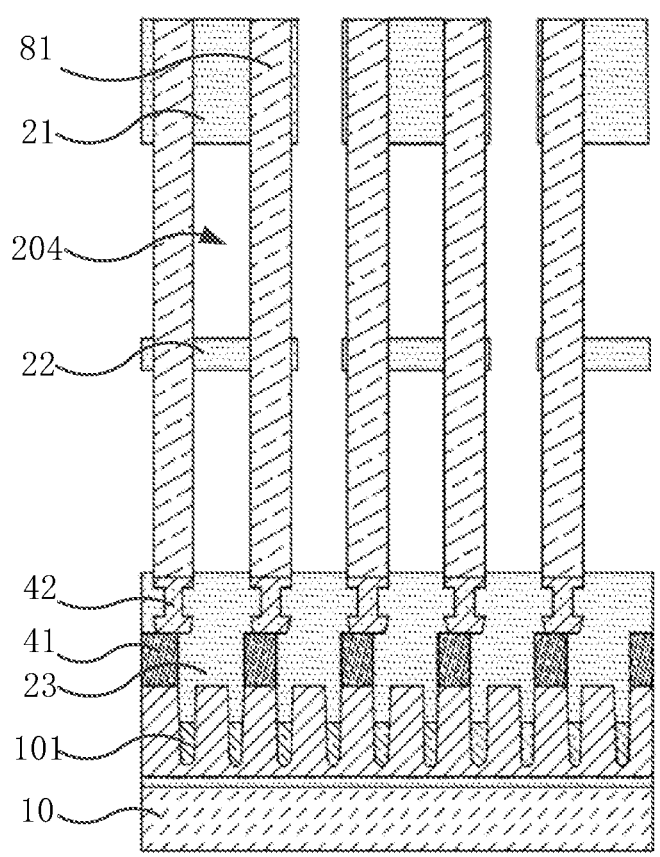
FIG. 15 is a cross-sectional view at A4-A4 in FIG. 14.

Referring to FIG. 14 and FIG. 15, in this embodiment, after the lower electrode layer 81 is formed, the step of forming the capacitor further includes: removing the sacrificial portion 24 and the sacrificial layer to form the filling space 204. For example, after the sacrificial portion 24 is removed, the first sacrificial layer 31 and the second sacrificial layer 32 are exposed. Herein, "exposure" means that part of the first sacrificial layer 31 and part of the second sacrificial layer 32 are not covered by the sacrificial portion 24. After the sacrificial portion 24 is removed, it is convenient to remove the first sacrificial layer 31 and the second sacrificial layer 32, such that the space between the first support layer 21 and the second support layer 22, the space between the second support layer 22 and the third support layer 23, and the filling hole 201 jointly constitute the filling space 204. Furthermore, the space between the first support layer 21 and the second support layer 22 and the space between the second support layer 22 and the third support layer 23 communicate together, such that the upper electrode layer formed subsequently in the space between the first support layer 21 and the second support layer 22 and the upper electrode layer formed subsequently in the space between the second support layer 22 and the third support layer 23 can be connected together.

It should be noted that, in this embodiment, after the lower electrode layer 81 is formed, the sacrificial portion 24 and the sacrificial layer are removed, such that the lower electrode layer 81 supports the support layer, thereby avoiding the collapse of the first support layer 21 and the second support.

In this embodiment, the sacrificial material 202, the material of the first sacrificial layer 31 and the material of the second sacrificial layer 32 are all the same, such that the sacrificial portion 24 and the sacrificial layer may be removed simultaneously by means of the same process, which is advantageous to simplifying the fabrication processes of the semiconductor structure and reducing the fabrication costs of the semiconductor structure. The sacrificial material, the material of the first sacrificial layer 31 and the material of the second sacrificial layer 32 may be, for example, silicon nitride ($Si_3N_4$), silicon oxide ($SiO_2$, SiO), or silicon oxynitride (SiON). Of course, in some other embodiments, the sacrificial material 202, the material of the first sacrificial layer 31 and the material of the second sacrificial layer 32 may also be set according to actual needs, which are not limited.

Furthermore, the material of the first support layer 21, the material of the second support layer 22 and the material of the third support layer 23 are all the same, but are different from the material of the sacrificial layer, such that etching selectivity of the support layer and etching selectivity of the sacrificial layer are different. Therefore, when the sacrificial portion 24 and the sacrificial layer are removed, the support layer is prevented from being etched away, which is advantageous to ensuring the support function of the support layer on the capacitor, and thus further preventing the capacitor from tilting. The material of the first support layer 21, the material of the second support layer 22 and the material of the third support layer 23 may be, for example, silicon carbon nitride (SiCN). Of course, in some other embodiments, the material of the first support layer 21, the material of the second support layer 22 and the material of the third support layer 23 may also be set according to actual needs, which are not limited.

In this embodiment, the sacrificial portion 24 and the sacrificial layer may be removed by means of a pickling etching process. The cleaning solution for removing the sacrificial layer and the sacrificial portion 24 may be, for example, phosphoric acid, which is advantageous to ensuring a removal effect on the sacrificial layer and the sacrificial portion 24, preventing the lower electrode layer 81 from being etched away, maintaining a contour of the lower electrode layer 81, and improving the performance of the capacitor. Furthermore, a material of the lower electrode layer 81 may be, for example, titanium nitride (TiN). Because the material of the lower electrode layer 81 is different from the material of the sacrificial layer, the etching selectivity of the lower electrode layer 81 and the etching selectivity of the sacrificial layer are different, which is advantageous to ensuring the contour of the lower electrode layer 81, thereby ensuring the performance of the capacitor formed.

In this embodiment, after the filling space 204 is formed, the step of forming the capacitor further includes: sequentially forming a dielectric layer and an upper electrode layer (not shown in the figure) on the exposed surface of the lower electrode layer 81, the lower electrode layer 81, the dielectric layer and the upper electrode layer constituting the capacitor. For example, the lower electrode layer 81 is formed in the capacitor hole 203, and after the sacrificial portion 24 and the sacrificial layer are removed, the lower electrode layer 81 positioned between the first support layer 21 and the second support, and the lower electrode layer 81 positioned between the second support layer 22 and the third support layer 23 are both exposed. Herein, "exposure" means that the lower electrode layer 81 is not covered by the sacrificial portion 24. After the dielectric layer and the upper electrode layer are formed on the surface of the lower electrode layer 81 positioned in the filling space 204, the dielectric layer covers the exposed surface of the lower electrode layer 81, and the upper electrode layer covers the exposed surface of the dielectric layer.

In some other embodiments, the lower electrode layer 81 may also cover the bottom wall and the side wall of the capacitor hole 203. When the dielectric layer and the upper electrode layer are sequentially formed on the surface of the lower electrode layer 81 positioned in the filling space 204, the dielectric layer and the upper electrode layer also cover the groove defined by the lower electrode layer 81.

The embodiments of the present disclosure further provide a semiconductor structure. The semiconductor structure includes a substrate 10, and a sacrificial layer and a support layer provided on the substrate 10. The support layer comprises a first support layer 21 and a second support layer 22 stacked, and the sacrificial layer comprises a first sacrificial layer 31 and a second sacrificial layer 32. The second sacrificial layer 32, the second support layer 22, the first sacrificial layer 31 and the first support layer 21 are sequentially stacked on the substrate 10 from bottom to top.

A capacitor is provided between the first support layer 21 and the substrate 10, and part of the capacitor penetrates through the first support layer 21, the first sacrificial layer 31, and the second support layer 22. A method for fabricating the capacitor includes: forming a filling hole 201 on the second support layer 22, where the filling hole 201 penetrates through the first support layer 21, the first sacrificial layer 31, and the second support layer 22; filling the filling hole 201 with a sacrificial material 202 to form a sacrificial portion 24; forming a filling space 204 on the substrate 10; and forming a capacitor in the filling space 204. In contrast to removing part of the support layer positioned in the middle of the sacrificial layer by using a part of the support layer 21 as a mask in the related technologies, in the embodiments of the present disclosure, before the filling space 204 is removed, part of the first support layer 21 and part of the second support layer 22 are simultaneously removed to form the filling hole 201 penetrating through the second support layer 22. It is not required to etch the first support layer 21 when removing the sacrificial layer by means of the filling hole 201, thereby avoiding loss of rest of the first support layer 21 from thinning and preventing cracks of the first support layer 21, which is advantageous to improving performance of the semiconductor structure.

Referring to FIG. 15, the support layer further includes a third support layer 23, where the third support layer 23 is positioned on a side of the second support layer close to the substrate 10, and the second sacrificial layer 32 is positioned between the third support layer 23 and the second support layer 22. The capacitor comprises a lower electrode layer 81, a dielectric layer, and an upper electrode layer. A terminal of the lower electrode layer 81 is in contact with the first support layer 21, and other terminal of the lower electrode layer 81 is in contact with the third support layer 23. The second support layer 22 is arranged around the lower electrode layer 81, the dielectric layer covers a surface of the lower electrode layer 81, and the upper electrode layer covers a surface of the dielectric layer. By arranging the first support layer 21, the second support layer 22 and the third support layer 23, the top, the middle and the bottom of the lower electrode layer 81 are respectively supported to prevent the lower electrode layer 81 from tilting.

In the above description, it is to be noted that unless specified or limited otherwise, terms such as "installation", "connecting" or "connection" should be understood in a broad sense, which may be, for example, a fixed connection, an indirect connection by means of an intermediary, an internal communication between two components or an interaction relationship between two components. For those of ordinary skill in the art, concrete meanings of the above terms in the present disclosure may be understood based on concrete circumstances. The orientation or position relations represented by the terms of "above", "below", "front", "back", "vertical", "horizontal", "top", "bottom", "inside", "outside" and the like are orientation or position relations shown based on the accompanying drawings, they are merely for ease of a description of the present disclosure and a simplified description instead of being intended to indicate or imply the apparatus or element to have a special orientation or to be configured and operated in a special orientation. Thus, they cannot be understood as limiting of the present disclosure. In the description of the present disclosure, "a plurality of" means two or more, unless otherwise expressly specified.

In the specification, the claims and the foregoing accompanying drawings of the present disclosure, a term such as a first, a second, a third or a fourth (if present) is intended to distinguish between similar objects but is not necessarily intended to describe a particular sequence or precedence order. It is to be understood that data used like this may be interchangeable where appropriate, such that the embodiments of the present disclosure described herein can be implemented in sequences excluding those illustrated or described herein. Furthermore, terms such as "comprise", "have" or other variants thereof are intended to cover a non-exclusive "comprise", for example, processes, methods, systems, products or devices comprising a series of steps or units are not limited to these steps or units listed explicitly, but comprise other steps or units not listed explicitly, or other steps or units inherent to these processes, methods, systems, products or devices.

Finally, it is to be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:

providing a substrate;

forming a sacrificial layer and a support layer on the substrate, wherein the support layer comprises a first support layer and a second support layer stacked, and the sacrificial layer comprises a first sacrificial layer and a second sacrificial layer, the second sacrificial layer, the second support layer, the first sacrificial layer, and the first support layer being sequentially stacked on the substrate from bottom to top;

forming a filling hole on the second support layer, the filling hole penetrating through the first support layer, the first sacrificial layer, and the second support layer, the first sacrificial layer and the second sacrificial layer being exposed by the filling hole;

filling the filling hole with a sacrificial material to form a sacrificial portion, wherein the sacrificial material, a material of the first sacrificial layer, and a material of the second sacrificial layer are all same;

removing part of the support layer, part of the sacrificial layer and part of the sacrificial portion to form a capacitor hole, an orthographic projection of the capacitor hole on the substrate at least partially overlapping with an orthographic projection of the sacrificial portion on the substrate;

forming a lower electrode layer in the capacitor hole;

removing the sacrificial portion and the sacrificial layer through a same process; and sequentially forming a dielectric layer and an upper electrode layer on an exposed surface of the lower electrode layer, and the lower electrode layer, the dielectric layer and the upper electrode layer constituting a capacitor.

2. The method for fabricating the semiconductor structure according to claim 1, wherein the support layer further comprises a third support layer, the third support layer being positioned on a surface of the substrate and positioned on a side of the second support layer close to the substrate, and the second sacrificial layer being positioned between the third support layer and the second support layer.

3. The method for fabricating the semiconductor structure according to claim 1, wherein the forming the filling hole comprises:

forming a first photoresist layer on the first support layer, the first photoresist layer having a first opening;

sequentially etching, using the first photoresist layer as a mask, part of the first support layer, part of the first sacrificial layer and part of the second support layer corresponding to the first opening to form the filling hole.

4. The method for fabricating the semiconductor structure according to claim 3, wherein part of the second support layer is removed by means of a dry etching process.

5. The method for fabricating the semiconductor structure according to claim 1, wherein the forming the sacrificial portion comprises:

the sacrificial material filling up the filling hole, and the sacrificial material covering a surface of the first support layer;

removing the sacrificial material by part of a thickness until the surface of the first support layer is exposed; and a remaining part of the sacrificial material in the filling hole being formed into the sacrificial portion, and a top surface of the sacrificial portion being flush with a top surface of the first support layer.

6. The method for fabricating the semiconductor structure according to claim 1, wherein the forming the capacitor hole comprises:

forming a second photoresist layer on the surface of the first support layer and a surface of the sacrificial portion, the second photoresist layer having a second opening; and sequentially etching, using the second photoresist layer as a mask, part of the first support layer, part of the first sacrificial layer, part of the second support layer and part of the second sacrificial layer corresponding to the second opening to form the capacitor hole.

7. The method for fabricating the semiconductor structure according to claim 6, wherein an orthographic projection of the second opening on the substrate at least partially overlaps with the orthographic projection of the sacrificial portion on the substrate; and orthographic projections of at least three of the second openings on the substrate are arranged at equal intervals around a circumference of the orthographic projection of the sacrificial portion on the substrate.

8. The method for fabricating the semiconductor structure according to claim 2, wherein a material of the first support layer, a material of the second support layer and a material of the third support layer are all same, but are different from a material of the sacrificial layer.

9. The method for fabricating the semiconductor structure according to claim 1, wherein the sacrificial portion and the sacrificial layer are removed by means of a pickling etching process.

10. The method for fabricating the semiconductor structure according to claim 1, wherein after providing the substrate and before forming the sacrificial layer and the support layer, the method further comprises:

forming a plurality of capacitor plugs arranged at intervals in the substrate; and forming a corresponding landing pad on each of the plurality of capacitor plugs, the landing pad being electrically connected to each of the plurality of capacitor plugs.

11. The method for fabricating the semiconductor structure according to claim 10, wherein the forming the capacitor hole comprises: the capacitor hole exposing a surface of each of the plurality of capacitor plugs, the lower electrode layer being electrically connected to each of the plurality of capacitor plugs.

12. A semiconductor structure fabricated by means of the method for fabricating the semiconductor structure according to claim 1.

* * * * *